United States Patent
Shi

(10) Patent No.: US 6,873,049 B2
(45) Date of Patent: Mar. 29, 2005

(54) NEAR HERMETIC POWER CHIP ON BOARD DEVICE AND MANUFACTURING METHOD THEREFOR

(75) Inventor: Fong Shi, Bellevue, WA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 10/630,777

(22) Filed: Jul. 31, 2003

(65) Prior Publication Data

US 2005/0040530 A1 Feb. 24, 2005

(51) Int. Cl.$^7$ .............................................. H01L 29/40
(52) U.S. Cl. ...................... 257/750; 257/787; 438/106
(58) Field of Search ................................ 257/750, 787, 257/712; 438/106, 127

(56) References Cited

U.S. PATENT DOCUMENTS 5,685,071 A * 11/1997 Gates, Jr. et al. ............. 29/840

OTHER PUBLICATIONS www.manufacturingcenter.com/dfx/archives, "Microsealing: Passivation Processing Provides Wafer–Level Hermetic Protection". Designfax, Jun. 2001, pp. 1 and 2, Nelson Publishing, Inc.

* cited by examiner

Primary Examiner—Roy Potter
(74) Attorney, Agent, or Firm—Sonnenschein Nath & Rosenthal LLP

(57) ABSTRACT

Near-hermetic performance has been reported for power semiconductor devices having a silicon carbide layer deposited on the surface at the semiconductor wafer level. The P-COB device also includes a conformal coating on the silicon carbide layer, which extends the expected lifetime of the P-COB device longer than those devices active coatings.

22 Claims, 2 Drawing Sheets

NEAR HERMETIC POWER CHIP ON BOARD DEVICE AND MANUFACTURING METHOD THEREFOR

The present invention relates to a near-hermetically sealed power-chip-on-board device and a manufacturing process therefor.

BACKGROUND OF THE INVENTION

Power ceramic hybrids have been widely used in aerospace systems for power control, power distribution, and power conversion. Because of the customized nature and material requirements associated with typically hermetically sealed power hybrid packages, power hybrids for electronics systems are high in cost and difficult to obtain. Further, in recent years, hermetically sealed components have become difficult to find, and a move has been made to commercial grade Plastic Encapsulated Microcircuits (PEMs).

However, there are long-term reliability problems associated with commercial PEM devices. PEM packaging often suffers from failures caused by contaminants embedded in epoxy molding compound, and by absorption of moisture.

Contaminants could severely degrade PEM devices' parametric performance. Moisture can penetrate through the PEM package and lead to corrosion, loss of adhesion of the epoxy and increased leakage current. Simulation models for predicting lifetime of PEMs lack validation data, and are therefore, questionable. On the other hand, subjecting parts through "test-to-failure" programs can be very costly and time consuming.

Further, Commercial Off-the-Shelf (COTS)/PEM devices are not in full compliance with certain requirements and not recommended for use for high reliability applications in severe environments.

Alternatively, to provide the appropriate hermeticity and power requirements for a reasonable cost, low-cost printed circuit boards have been widely used as substrates for direct mounting of semiconductors in commercial electronic products. This approach is often referred to as Chip-on-Board (COB) or MCM-L (multi-chip module-laminate) packaging technique. However, the COB approach has been typically used for circuit applications at low power levels.

In particular, conventional COB electronic assemblies often use a glob-top material for device encapsulation. However, a glob-top does not provide the hermeticity and power required, or good mechanical protection against damage from foreign objects, and is relatively ineffective as a seal against moisture and contaminants in severe environments.

Further, in power electronics applications, the electronic components are constantly under severe electrical and thermal stress due to high transient voltages and high transient current, with fast rise and fall switching times present in the circuit. Sufficient heat removal for keeping device junction temperatures below their maximum allowable limits becomes a major issue in power hybrid design.

To prevent potential ground current loops, electrical isolation is required between the device terminal connections and the heat sink on which the device is mounted. Depending on specific system applications, electrical isolation requirements could reach from several hundred to several thousand volts.

Accordingly, low cost Commercial Off-the-Shelf (COTS) electronics components, such as commercial near-hermetic COB packaging or a Power-Chip-On-Board (P-COB) technology for high power levels, as replacements for high cost, hermetically sealed electronics parts for, for example, military applications, are needed to meet avionics requirements and reduce component costs.

SUMMARY OF THE INVENTION

The present invention relates to a near-hermetically sealed power chip-on-board (P-COB) device and a manufacturing process therefor.

In one embodiment consistent with the present invention, the P-COB device is includes a substrate; a semiconductor device disposed on the substrate, the semiconductor device including a silicon nitride passivation upper layer; and a sealant disposed directly on the silicon nitride layer.

In one embodiment consistent with the present invention, the substrate is a polyimide PWB, and in another embodiment consistent with the present invention, the substrate is a direct bond copper substrate.

A die attachment is used to attach the semiconductor device to the substrate.

In another embodiment consistent with the present invention, the sealant is formed of silicon carbide approximately 4000 Angstroms in thickness.

In yet another embodiment consistent with the present invention, an aluminum bond pad and aluminum wires are disposed on the semiconductor device.

In yet another embodiment consistent with the present invention, a conformal coating is disposed on the sealant, the aluminum bond pad and the aluminum wires.

In yet another embodiment consistent with the present invention, the conformal coating is less than 2 mils in thickness.

In yet another embodiment consistent with the present invention, a protective cover is disposed on the conformal coating.

In yet another embodiment consistent with the present invention, the semiconductor device is a power MOSFET.

In yet another embodiment consistent with the present invention, a hear-hermetic device includes a substrate; an electronics package disposed on the substrate; a sealant disposed directly on a surface of the electronics package; and a conformal coating disposed on the sealant.

In yet another embodiment consistent with the present invention, a protective cover is disposed on the conformally-coated electronics package.

In yet another embodiment consistent with the present invention, a power chip-on-board (P-COB) device includes a substrate; a semiconductor device disposed on the substrate, the semiconductor device including a silicon nitride passivation upper layer, a silicon carbide layer disposed directly on the silicon nitride layer; and a conformal coating disposed on the silicon carbide layer.

In yet another embodiment consistent with the present invention, a method of manufacturing a near-hermetic power-chip-on-board (P-COB) device, includes providing a substrate; attaching a semiconductor device to the substrate; and directly depositing a sealant over an upper passiviation layer of silicon nitride of the semiconductor device.

In yet another embodiment consistent with the present invention, the method further includes disposing an aluminum bond pad and aluminum wires on said semiconductor device.

In yet another embodiment consistent with the present invention, the method further includes disposing a conformal coating on the sealant.

In yet another embodiment consistent with the present invention, the method further includes disposing a protective cover on the conformal coating.

In yet another embodiment consistent with the present invention, the semiconductor device is a power MOSFET.

In yet another embodiment consistent with the present invention, the substrate is a polyimide PWB, and in another embodiment consistent with the present invention, the substrate is a direct bond copper substrate.

In yet another embodiment consistent with the present invention, the method includes attaching the semiconductor device to the substrate using a die attachment.

Finally, in yet another embodiment consistent with the present invention, the sealant is a silicon carbide layer deposited to a thickness of approximately 4000 Angstroms.

Thus has thus been outlined, some features consistent with the present invention in order that the detailed description thereof that follows may be better understood, and in order that the present contribution to the art may be better appreciated. There are, of course, additional features consistent with the present invention that will be described below and which will form the subject matter of the claims appended hereto.

In this respect, before explaining at least one embodiment consistent with the present invention in detail, it is to be understood that the invention is not limited in its application to the details of construction and to the arrangements of the components set forth in the following description or illustrated in the drawings. Methods and apparatuses consistent with the present invention are capable of other embodiments and of being practiced and carried out in various ways. Also, it is to be understood that the phraseology and terminology employed herein, as well as the abstract included below, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the methods and apparatuses consistent with the present invention.

DETAILED DESCRIPTION OF THE INVENTION

The present invention relates to a Power Chip-on-Board (P-COB) packaging concept, in which low-cost laminate printed wiring boards (PWB) and commercial COB processes are used as an alternative to the traditionally expensive power hybrids.

Figure 1:
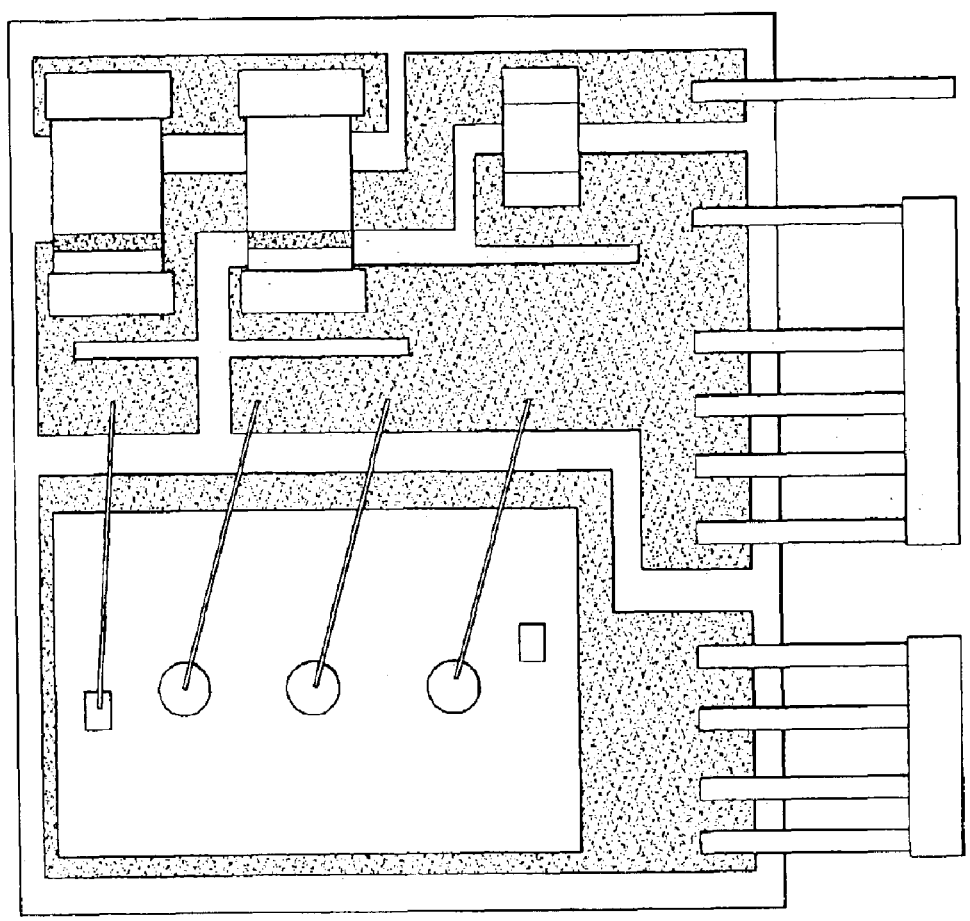
FIG. 1 depicts a top view of a schematic layout of a P-COB device according to one embodiment consistent with the present invention.

The P-COB device consistent with the present invention was designed as a "pin-for-pin drop-in" for the conventional hybrid design from which it was derived, to facilitate component tests and subsequent "in-power supply" evaluation. A schematic layout of the P-COB device 100 is shown in FIG. 1.

The P-COB device 100 is created post-process on a finished semiconductor wafer, such as a Metal Oxide Semiconductor Field Effect Transistor (MOSFET). In one embodiment consistent with the present invention, the P-COB device 100, as shown in FIG. 2, employs a polyimide PWB substrate 101 as a lower cost alternative to a conventional multi-layer ceramic substrate. The polyimide PWB 101 is resistant to temperatures up to 260° C. However, in another embodiment consistent with the present invention, an isolated direct bond copper substrate can be used.

In one embodiment consistent with the present invention, a mesh of thermal via integrated into the PWB 101 provides an effective thermal path for the heat produced by the power semiconductor to dissipate to a "cold plate", where the P-COB device 100 is physically attached during testing, for example.

In order to seal the P-COB package 100, existing methods include depositing a silicon carbide (SiC) sealant (for example, Chip Seal™ by Dow Corning) as a spunon coating of a flowable silicon dioxide ($SiO_2$) layer, to planarize the wafer surface, followed by a topcoat of silicon carbide (SiC) to seal the wafer. Openings to the integrated circuit (IC) contact pads are then etched through the SiC and $SiO_2$. The contact pads are covered with a barrier metal of titanium tungsten (TiW) and then with gold (Au), sealing the etched openings and providing excellent electrical contact on the next level of interconnect. All processes are accomplished using standard semiconductor manufacturing equipment.

However, in the P-COB device 100 of the present invention, modifications are made to this existing process. The panel assembly of the P-COB device 100 is automated, according to one embodiment consistent with the present invention.

Figure 2A:
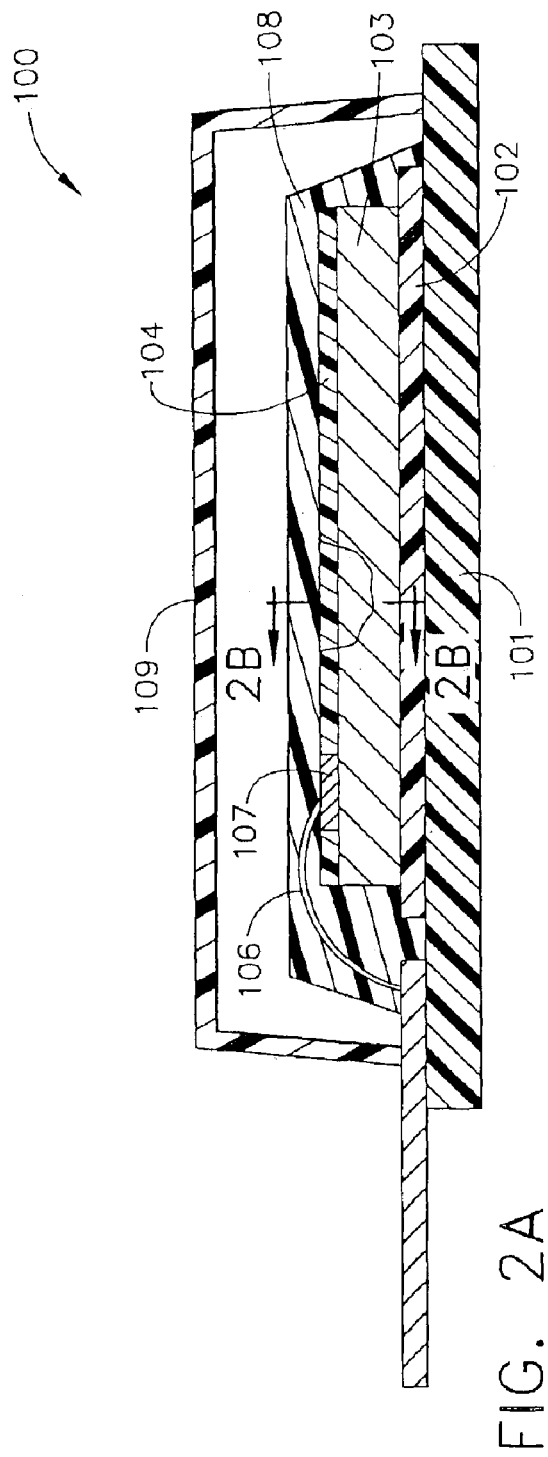
FIG. 2A depicts a schematic cross-sectional view of a P-COB device according to one embodiment consistent with the present invention.
Figure 2B:
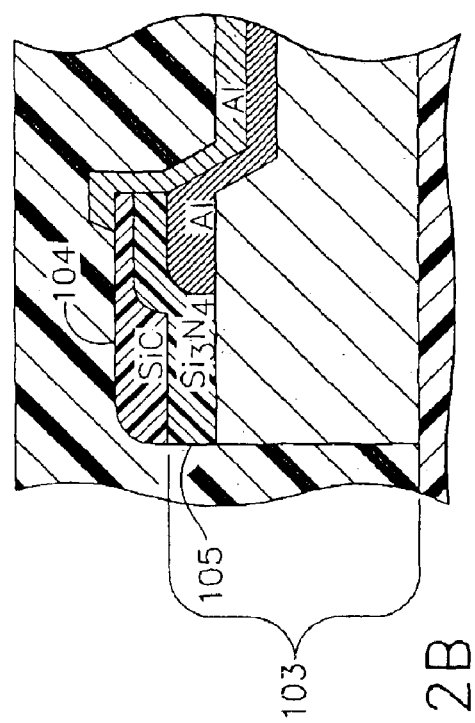
FIG. 2B depicts a schematic cross-sectional exploded view of the device of FIG. 2A.

In one embodiment consistent with the present invention, a die attachment 102 attaches a MOSFET 103 to the polyimide PWB substrate 101 (see FIG. 2A). A SiC sealant 104 (for example, Chip Seal™ by Dow Corning) which forms a layer of approximately 4000 Angstroms, is directly deposited over the existing silicon nitride primary passivation layer 105 on the power semiconductor wafer, with no need for flowable oxide (see FIG. 2B). However, in the P-COB device 100 consistent with the present invention, with the use of power MOSFETs where larger diameter (5-mil) aluminum bond wires 106 are used, aluminum bond pads 107 are preferred (see FIG. 2A). Openings to the integrated circuit (IC) contact pads are then reopened and etched through the SiC 104. The contact pads are covered with a deposit of aluminum 107 to cover over the pad opening and provide the surface for aluminum wire bonding, sealing the etched openings and providing excellent electrical contact on the next level of interconnect. Thus, an aluminum cap 107, and not TiW/Au is used. High temperature solder, for parts attachment is used in the present configuration, and all processes are accomplished using standard semiconductor manufacturing and assembly equipment.

The sealant used in the present invention is applied by a standard process technology, and is compatible with all current MCM interconnection approaches, including wire bond TAB, flip chip etc.

Unlike the vast majority of semiconductor devices that are processed laterally, the drain terminal of a double-diffused power MOSFET 103 according to one embodiment consistent with the present invention, is vertically positioned on the bottom of the die. The four edges of the die are still considered active drain regions. In addition, the aluminum bond wires 106 and aluminum pads 107 also require protection against moisture.

For these reasons, in one embodiment consistent with the present invention, a final conformal coating 108 (for example, of Parylene by Specialty Coating Systems) is applied after the assembly of the P-COB device 100, to usually less than 1 mil thickness (see FIG. 2A). Thus, both a silicon carbide coating 104 and a conformal coating 108 are used to achieve near-hermetic performance in the P-COB device 100 of the present invention. Thus, each individual semiconductor die is sealed by this coating process.

In one embodiment consistent with the present invention, liquid crystal polymer (LCP) covers 109 (see FIG. 2A), which may be epoxied in place, are used to protect the devices 100 from mechanical damage due to handling.

By a rough estimate, the cost of materials and assembly of the P-COB device 100 of the present invention, is about 60% of that of the conventional power ceramic hybrid, a significant cost saving in production.

Table 1 describes the difference between a conventional power ceramic hybrid and the P-COB device 100 consistent with the present invention.

TABLE 1

| Conventional Ceramic Power Hybrid | Power-Chip-On-Board Device |
| --- | --- |
| Multi-layer co-fired ceramic substrate | Inexpensive PWB substrate |
| Individually assembled | Automated panel assembly |
| Both gold and aluminum wire bonding | Aluminum wire bonding for bare dies. High temperature solder for parts attachment. |
| All components in bare die form | Mix of surface mount parts and bare die |
| Hermetically sealed with metal lids | Near-hermetic by combination of sealant, conformal coating, and LCP cover |

In order to verify the effectiveness of the sealant coating process according to the present invention, an experiment was conducted with various packaging options (see Table 2).

The test samples according to one embodiment consistent with the present invention, employed a silicon carbide sealant (for example, Chip Seal™ by Dow Corning), coated and post-processed power MOSFET devices. Surface mounted discrete parts were used in the test samples, in place of bare dies as found in the conventional hybrid design. Interconnections of the surface mounted parts to the substrate were achieved with high temperature solder in the test samples. Finally, in the test samples according to the present invention, a Parylene coating was applied to overcoat the entire assembly.

In the experiment, a total of 125 P-COB samples were divided into five groups (A, B, C, D, and E). Each Group contained 25 samples. Group A was the Control Group without any coating protection at the die and assembly levels. Groups A, B, and C consisted of regular, uncoated power MOSFET dies. Groups D and E had sealant coated MOSFET dies, which were formed in accordance with the present invention. Table 2 shows the test samples and their features.

TABLE 2

| Standard Uncoated MOSFET | | | SiC Coated MOSFET | |
| --- | --- | --- | --- | --- |
| Group A | Group B | Group C | Group D | Group E |
| No conformal coating | No conformal coating | Parylene coating | No conformal coating | Parylene coating |
| Cover and tape | Cover and epoxy | Cover and tape | Cover and epoxy | Cover and tape |

The Group C and Group E samples were covered with a Parylene conformal coating to 2 mils thick after assembly was completed. The coating covered all components, traces, aluminum bond wires and aluminum bond pads. The P-COB lead-frames and underside were masked off during the coating process.

Finally, all of the P-COB samples were attached with LCP covers for protection against mechanical damage during shipping and handling.

In order to determine the performance of the various test samples, thermal measurements were performed on a 3-axis table where a laser assisted infrared camera recorded the junction temperature of the power MOSFET die. Test samples were mounted on aluminum cold plates with 5 kV isolation thermal pads. Voltage and current were applied to the test samples and power dissipation was computed.

The test results indicated a faster thermal response (or lower thermal capacitance) from the P-COB samples assembled according to the present invention, than the conventional ceramic hybrids. Having greater mass, the conventional ceramic power hybrids exhibited higher thermal capacitance than the P-COB samples.

Eventually, junction temperatures of the MOSFETs of both types of test samples converged to the same level. It was noted that there was no difference in thermal behaviors under steady state conditions.

Thus, the P-COB test samples showed a faster thermal response and as good a thermal behavior with the use of a lower cost substrate, than conventional, more expensive ceramic power hybrids.

In environmental testing, the test samples of Table 2 were exposed to a combination of Stress Testing and Temperature Cycling. The P-COB's environmental test was a combination of a 1,000 hour variable voltage biased (from 5 V to 150 Vdc), Highly Accelerated Stress Test (HAST) at 130° C./85% RH with 1,000 temperature cycles between −55° C. and 125° C. These severe test conditions were chosen to ensure the failures of uncoated parts (i.e., Group A) and to demonstrate durability of the coated parts (i.e., Group E), and far exceeded the 96-hour industry HAST standard to ensure failures.

Groups A and B were uncoated FETs with encapsulation options, with Group A being the Control Group with no coatings. Group E was SiC coated FETs with a taped LCP cover as an encapsulation option.

The test was divided into four runs. Electrical testing, both functional and switching tests of the samples before-and-after each test run, was performed. Parametric and catastrophic failures such as changes of device threshold, leakage, on-resistance, breakdown voltages and open/short were used as test criteria. Switching testing alone could not be used to identify failures due to moisture, since the P-COB samples (i.e., Group E) that failed parametric tests could still pass the switching test.

The final test results charted parametric or catastrophic failure, in percentages, vs. hours and cycles that were undergone by the test samples.

Taking the Group A and Group B results, in comparison with the Group E results, the results showed that samples from Group E, which is consistent with the present invention in having both the sealant and the conformal coating, clearly is outlived all other groups over time by having a lower catastrophic failure rate compared to Groups A and B, but as much as 40%–50%.

Thus, the environmental test results provided the following important findings:

the SiC sealant coating protects silicon power semiconductor devices against moisture intrusion.

SiC sealant coating protects silicon power semiconductor devices from process contamination.

SiC sealant coating combined with conformal coating will further prolong the P-COB device's life.

Further, the expected reliability levels of the different test groups when subjected to the same test conditions can be determined using the time of the failures, and the following Hallberg-Peck Failure Rate formula:

$$\lambda = \frac{x^2 \cdot 10^9}{2 \cdot t \cdot (RHt/RHu)^3 \cdot e^{[E_A/k \cdot (Tu^{-1} Tt^{-1})]}}$$

where $x^2$ is the Chi-square distribution at confidence level of 60% under given failure(s); RHt and RHu are relative humidity under test and use conditions, 85% RH and 85% RH; Tu and Tt are junction temperatures under use and test conditions, 85° C. and 130° C.; $E_A$ is the activation energy of 0.9 eV; k is the Boltzman's constant, 8.617e–5 eV; t is the total device-time in hours that equals to the number of samples multiplied by test hours.

At the end of 488 hour and 50V biased HAST, the lifetimes at 85° C./85% RH of Group E and Group A were predicted using the Hallberg-Peck model to be about 11.65 years and 2.03 years respectively, implying a relative ratio of 5.73:1. In other words, the P-COB parts consistent with the present invention, which include SiC sealant and conformal coating similar to those from Group E, will be expected to last about 5.73 times longer than uncoated parts such as those from Group A. This estimate for lifetime of parts at 130° C./85% RH is based on industry standards for activation energy and confidence level. The estimate is conservative, however, given the much more severe environmental test conditions, and the higher stress levels that the test samples have undergone.

Further experiments were conducted on the test samples, including wire pull strength and die shear strength, to determine any differences between conventional ceramic hybrids and the P-COB consistent with the present invention.

Test results on wire pull strength showed that wire pull strength degrades after exposure to various environmental test conditions, with there being no apparent difference in wire pull strength between parts coated with the sealant and parts without the sealant coating, but with the groups having a conformal coating, having higher wire pull strengths regardless of the test conditions.

With respect to the die shear testing, the results showed that die shear strength degrades after exposure to various environmental test conditions, but the conformal (i.e., Parylene coating) having somewhat positive effects on die shear strength.

Thus, the SiC sealant coating process of the present invention protects silicon power semiconductor devices from moisture and process contamination, and when combined with a conformal (Parylene) coating, will further prolong the device life in environmentally stressful conditions. The low-cost P-COB concept of the present invention, utilizing SiC-coated power semiconductor devices mounted on low-cost PWB substrates presents an alternative to conventional ceramic power hybrids typically used in military hardware. For equal volume production, the cost of the sealant and conformal coated P-COB devices according to the present invention is about 60% of what full hermetic conventional ceramic power hybrids cost. The PCOB device consistent with the present invention demonstrates an enabling technology for the implementation of low-cost power electronics components; and will ultimately reduce current and future procurement and life cycle costs for numerous systems.

It should be emphasized that the above-described embodiments of the invention are merely possible examples of implementations set forth for a clear understanding of the principles of the invention. Variations and modifications may be made to the above-described embodiments of the invention without departing from the spirit and principles of the invention. All such modifications and variations are intended to be included herein within the scope of the invention and protected by the following claims.

What is claimed is:

1. A near-hermetic power chip-on-board (P-COB) device comprising:

a substrate formed at least in part from a polyimide PWB;

a semiconductor device disposed on said substrate, said semiconductor device including a silicon nitride passivation upper layer; and a sealant disposed directly on said silicon nitride layer.

2. A near-hermetic power chip-on-board (P-COB) device comprising:

a substrate is formed at least in part from a direct bond copper substrate;

a semiconductor device disposed on said substrate, said semiconductor device including a silicon nitride passivation upper layer; and a sealant disposed directly on said silicon nitride layer.

3. The P-COB device according to claim 1, further comprising:

a die attachment which attaches said semiconductor device to said substrate.

4. A near-hermetic power chip-on-board (P-COB) device comprising:

a substrate;

a semiconductor device disposed on said substrate, said semiconductor device including a silicon nitride passivation upper layer; and a sealant disposed directly on said silicon nitride layer sealant formed at least part from silicon carbide.

5. The P-COB device according to claim 4, wherein said silicon carbide is deposited at a thickness of approximately 4000 Angstroms.

6. A near-hermetic power chip-on-board (P-COB) device comprising:

a substrate;

a semiconductor device disposed on said substrate, said semiconductor device including a silicon nitride passivation upper layer;

a sealant disposed directly on said silicon nitride layer sealant; and an aluminum bond pad and aluminum wires disposed on said semiconductor device.

7. The P-COB device according to claim 6, further comprising:

a conformal coating disposed on said sealant, said aluminum bond pad and said aluminum wires.

8. The P-COB device according to claim 7, further comprising:

a protective cover disposed on said conformal coating.

9. A near-hermetic power chip-on-board (P-COB) device comprising:

a substrate:

a semiconductor device comprising a power MOSFET disposed on said substrate, said semiconductor device including a silicon nitride passivation upper layer; and a sealant disposed directly on said silicon nitride layer sealant.

10. The P-COB device according to claim 7, wherein said conformal coating is less than 2 mils in thickness.

11. A near-hermetic device comprising:

a substrate;

an electronics package disposed on said substrate;

a sealant disposed directly on a surface of said electronics package; and a conformal coating disposed on said sealant.

12. The near-hermetic device according to claim 11, further comprising:

a protective cover disposed on said conformally-coated electronics package.

13. A power chip-on-board (P-COB) device comprising:

a substrate;

a semiconductor device disposed on said substrate, said semiconductor device including a silicon nitride passivation upper layer;

a silicon carbide layer disposed directly on said silicon nitride layer; and a conformal coating disposed on said silicon carbide layer.

14. A method of manufacturing a near-hermetic power-chip-on-board (P-COB) device comprising:

providing a substrate;

attaching a semiconductor device to said substrate;

directly depositing a sealant over an upper passiviation layer of silicon nitride of said semiconductor device; and disposing an aluminum bond pad and aluminum wires on said semiconductor device.

15. The method according to claim 14, further comprising:

disposing a conformal coating on said sealant.

16. The method according to claim 15, further comprising:

disposing a protective cover on said conformal coating.

17. The method according to claim 14, wherein said semiconductor device is a power MOSFET.

18. The method according to claim 14, wherein said substrate is a polyimide PWB.

19. The method according to claim 14, wherein said substrate is a direct bond copper substrate.

20. The method according to claim 14, further comprising:

attaching said semiconductor device to said substrate using a die attachment.

21. The method according to claim 14, wherein said sealant is a silicon carbide.

22. The method according to claim 21, wherein said silicon carbide is deposited to a thickness of approximately 4000 Angstroms.

* * * * *